United States Patent [19]
Goldberg et al.

[11] Patent Number: 5,745,284
[45] Date of Patent: Apr. 28, 1998

[54] SOLID-STATE LASER SOURCE OF TUNABLE NARROW-BANDWIDTH ULTRAVIOLET RADIATION

[75] Inventors: Lew Goldberg, Fairfax, Va.; Dahv A.V. Kliner; Jeffrey P. Koplow, both of Cambridge, Mass.

[73] Assignee: President and Fellows of Harvard College, Cambridge, Mass.

[21] Appl. No.: 640,568

[22] Filed: May 1, 1996

Related U.S. Application Data

[63] Continuation-in-part of Ser. No. 609,768, Feb. 23, 1996, abandoned.

[51] Int. Cl.$^6$ ............................... H01S 3/00; H01S 3/10
[52] U.S. Cl. .......................... 359/344; 359/328; 372/22
[58] Field of Search ............................ 372/22; 359/341, 359/344, 328, 329

[56] References Cited

U.S. PATENT DOCUMENTS

| Re. 35,215 | 4/1996 | Waarts et al. | 372/108 |
|---|---|---|---|
| 4,907,238 | 3/1990 | Chun et al. | 372/32 |
| 5,175,643 | 12/1992 | Andrews | 359/339 |
| 5,177,752 | 1/1993 | Ohya et al. | 372/22 |
| 5,321,718 | 6/1994 | Waarts et al. | 372/22 |
| 5,457,707 | 10/1995 | Sobey et al. | 372/20 |
| 5,530,582 | 6/1996 | Clark | 359/333 |
| 5,561,676 | 10/1996 | Goldberg | 372/18 |

OTHER PUBLICATIONS

N. Finkelstein, et al., "The Development of a Tunable Single–Frequency Ultraviolet Laser Source for UV Filtered Rayleigh Scattering," *Dept. of Mechanical & Aerospace Engineering*, Princeton University, Princeton, NJ 08544, pp. 1–7 (Jan. 10–13, 1994).

T. Meguro, et al., "Solid–State Tunable Deep–Ultraviolet Laser System from 198–300 nm," *Optics Letters*, 19(2):102–104 (Jan. 1994).

C. Zimmermann, et al., "All Solid State Laser Source for Tunable Blue and Ultraviolet Radiation," *Appl. Phys. Lett.* 66(18):2318–2320 (May 1995).

L. Goldberg, et al., "Tunable UV Generation at 286 nm By Frequency Tripling of a High–Power Mode–Locked Semiconductor Laser," *Optics Letters*, 20(15):1640–1642 (Aug. 1995).

L. Goldberg, et al., "Deep–UV Generation by Frequency Quadrupling of a High–Power GaAlAs Semiconductor Laser," *Optics Letters*, 20(10) : 1145–1147 (1995).

L.E. Busse, et al., "3.0W Blue Light Generation by Frequency Doubling of Broad Area Semiconductor Amplifier Emission," *Electronics Letters* 29(1):77–78 (Jan. 1993).

L. Goldberg, et al., "Blue Light Generation Using a High Power Tapered Amplifier Mode–Locked Laser," *Appl. Phys. Lett.* 65(5):522–524 (Aug. 1994).

L. Goldberg, et al., "High Power Continuous Wave Blue Light Generation in KNbO$_3$ Using Semiconductor Amplifier Seeded by a Laser Diode," *Appl. Phys. Lett.* 63(17):2327–2329 (Oct. 1993).

(List continued on next page.)

*Primary Examiner*—Mark Hellner
*Attorney, Agent, or Firm*—Hamilton, Brook, Smith & Reynolds, P.C.

[57] ABSTRACT

A solid-state laser source of tunable and narrow-bandwidth UV light is disclosed. The system relies on light from a diode laser that preferably generates light at infrared frequencies. The light from the seed diode laser is pulse amplified in a light amplifier, and converted into the ultraviolet by frequency tripling, quadrupling, or quintupling the infrared light. The narrow bandwidth, or relatively pure light, of the seed laser is preserved, and the pulse amplifier generates high peak light powers to increase the efficiency of the nonlinear crystals in the frequency conversion stage. Higher output powers may be obtained by adding a fiber amplifier to power amplify the pulsed laser light prior to conversion.

51 Claims, 3 Drawing Sheets

OTHER PUBLICATIONS

D. Rafizadeh, et al., "Kilowatt Pulses at 1.55 μm from a Singlemode Erbium–Doped Fibre Amplifier," *Electronics Letters*, 30(4):317–318 (17 Feb. 1994).

B. Desthieux, et al., "111 kW (0.5mJ) Pulse Amplification at 1.5 μm Using a Gated Cascade of Three Erbium–Doped Fiber Amplifiers," *Appl. Phys. Lett.* 63(5):586–588 (2 Aug. 1993).

I.N. Duling, III, et al., "Single–Polarisation Fibre Amplifier," *Electronics Letters*, 28(12):1126–1128 (4 Jun. 1992).

SOLID-STATE LASER SOURCE OF TUNABLE NARROW-BANDWIDTH ULTRAVIOLET RADIATION

RELATED APPLICATIONS

This application is a Continuation-in-Part of U.S. Ser. No. 08/609,768, filed Feb. 23, 1996, the entire teachings of which are incorporated herein by reference now abandoned.

GOVERNMENT SUPPORT

The Government has rights in this invention pursuant to Contract Number NCC2-786 awarded by the National Aeronautics and Space Association (NASA).

BACKGROUND OF THE INVENTION

The generation of tunable, visible and ultraviolet (UV) laser light in a solid-state device has been the goal of research for some time. Generally, the research has followed two divergent paths. Attempts at direct generation have met with limited success. Although blue laser diodes have been successfully manufactured, the devices tend to be unstable and have short operating lifetimes. The other path relies on frequency conversion of laser light in the near infrared (IR) range to generate visible light. With available nonlinear crystals such as potassium niobate ($KNbO_3$) blue light output powers in the hundreds of milliWatts (mW) range are achievable with current technology.

Laser light generation at shorter wavelengths, extending into the UV, is usually accomplished by frequency tripling and quadrupling. The discovery of β-bariumborate, β-$BaB_2O_4$ (BBO), lithium borate, $Li_3BO_5$ (LBO), and a number of other non-linear crystals, which can generate and are transmissive to these shorter wavelengths, has been critical to the advances in this area. Tunable, narrow bandwidth systems are necessary for spectroscopic applications and other applications requiring accurate wavelength selection or control. UV light in this spectral region is particularly useful for detection of small molecules. Typically, these systems start with a tunable dye laser or Ti:Sapphire source.

SUMMARY OF THE INVENTION

While in many cases, conventional UV light systems are nominally solid-state, they are difficult to maintain, are large and costly, have significant cooling requirements, typically require pump lasers, and have high power requirements. These properties have generally limited the systems to laboratory applications where kiloWatt (kW) power supplies, cooling water, and stable operating environments are available. A need exists for an inexpensive, rugged, and field-compatible UV light source that generates useful amounts of light.

The present invention is directed to a solid-state laser source for generation of tunable and narrow-bandwidth light in a rugged system that is compact, lightweight, electrically efficient, operates at room temperature, and has no significant cooling requirements. This is achieved by relying on light from a diode laser that preferably generates light at near IR wavelengths. A conversion stage converts the light into the UV by frequency tripling, quadrupling, or quintupling the infrared light.

The principal problem in relying on a diode laser, however, is the fact that compared with Ti:Sapphire lasers, for example, the laser light output power is relatively small. Because the frequency conversion efficiency is nonlinear with the laser input power, low power lasers result in low conversion efficiencies. The fourth harmonic power, e.g., varies as the fourth power of the input optical power (until the onset of pump depletion). Small decreases in the input light power, therefore, lead to dramatic losses in the output power. As a result, it is commonly thought that generation of useful UV, i.e, greater than nanoWatts (nW), with a diode source is not feasible.

The present invention overcomes these problems by pulse amplifying the light from a continuous wave (cw) seed diode laser in a semiconductor and/or diode-pumped fiber optical amplifier. This configuration allows the spectral characteristics to be controlled by the seed laser. Thus, the narrow bandwidth, or relatively pure light, of the seed laser is preserved. The pulsed amplifier generates high peak light powers to increase the efficiency of the frequency conversion in the nonlinear crystals while maintaining acceptable average powers. Thus, according to the invention, microWatts or even milliWatts of UV light can be produced starting with an IR diode laser.

In specific embodiments, the amplifier is preferably a tapered amplifier. Devices of this class have a very uniform power density distribution, which allows the devices to produce higher peak powers with high beam quality without damage from hot spots.

In other specific embodiments, an electrical pulse generator is used to drive the optical amplifier. Pulses having a low duty cycle 1–20% and a duration of 1–100 nsec are preferred.

The frequency conversion stage may frequency double the IR light from the diode laser using a $KNbO_3$ crystal and then triple the light in an ammonium dihydrogen arsenate (ADA) crystal. If shorter wavelengths are desired, the IR light can be doubled in a $KNbO_3$ crystal and then quadrupled in a BBO crystal.

In still other embodiments, a fiber amplifier may be added between the pulsed seed source, a tapered amplifier or other pulsed seed laser for example, and the frequency conversion stage to power amplify the pulsed laser light prior to conversion. The fiber amplifier is preferably a high-power, rare-earth-doped fiber amplifier that is pumped by a laser diode or array of diodes. Thus, in this embodiment, the seed laser determines the spectral properties of the UV light, the device used for amplitude modulation determines the temporal properties, and the fiber amplifier determines the peak power, thereby allowing each of these parameters to be independently optimized. The frequency conversion stage may be adapted to frequency quintuple the output of the fiber amplifier operating at 1,000–1,100 nanometers to generate UV radiation at 200–220 nanometers, a region of interest for a number of spectroscopic applications.

One potential application for the UV light generation system is in a trace species detection system in which a detector is used to monitor the absorption of the laser light and/or intensity of fluorescence from the species when excited by the laser light. A controller tunes the diode laser on and off an absorption band of the species of interest to determine the abundance (concentration or mixing ratio) of the species.

In general according to another aspect, the invention can also be characterized in the context of a method for generating ultraviolet light. This method features generating laser light with a tunable diode laser and then pulse amplifying the laser light. The pulsed light is then converted into ultraviolet light.

In specific embodiments, the pulsed laser light may be power amplified in a fiber amplifier. Filtering here is helpful to suppress amplified spontaneous emission. Although frequency-domain, i.e., bandpass, filtering is useful, a time-domain filter is preferred, usually with an acousto-optic filter. Alternatively, a saturable absorber (e.g., chromium-doped YAG) can be used for this purpose.

In general, according to still another aspect, the invention features a laser system which comprises a seed laser source to generate amplitude modulated laser light. A fiber amplifier is used to power amplify the amplitude modulated laser light for a frequency conversion stage, which converts the amplified laser light into ultraviolet light.

In specific embodiments, the pulsed seed laser source may comprise a continuous wave laser diode and an amplitude modulator, such as an acousto-optic modulator, Pockels cell, or fiber-coupled Mach-Zehnder interferometer. In applications where it is necessary to achieve very high peak power (while maintaining control of spectral bandwidth), the use of a very fast modulator (narrow pulse width) is important for the suppression of stimulated Brillouin scattering in the fiber amplifier. Amplitude modulation of the seed laser using the fiber-coupled Mach-Zehnder interferometer, whose time response can be as short as 100 ps, is the preferred embodiment in such applications. Alternatively, the seed laser source could include a pulsed tapered amplifier or a pulsed distributed feedback laser.

In other embodiments, an acousto-optic filter is useful to suppress amplified spontaneous emission in the fiber amplifier although this could be also achieved with bandpass filtering or the saturable absorber.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE DRAWINGS

Figure 1:
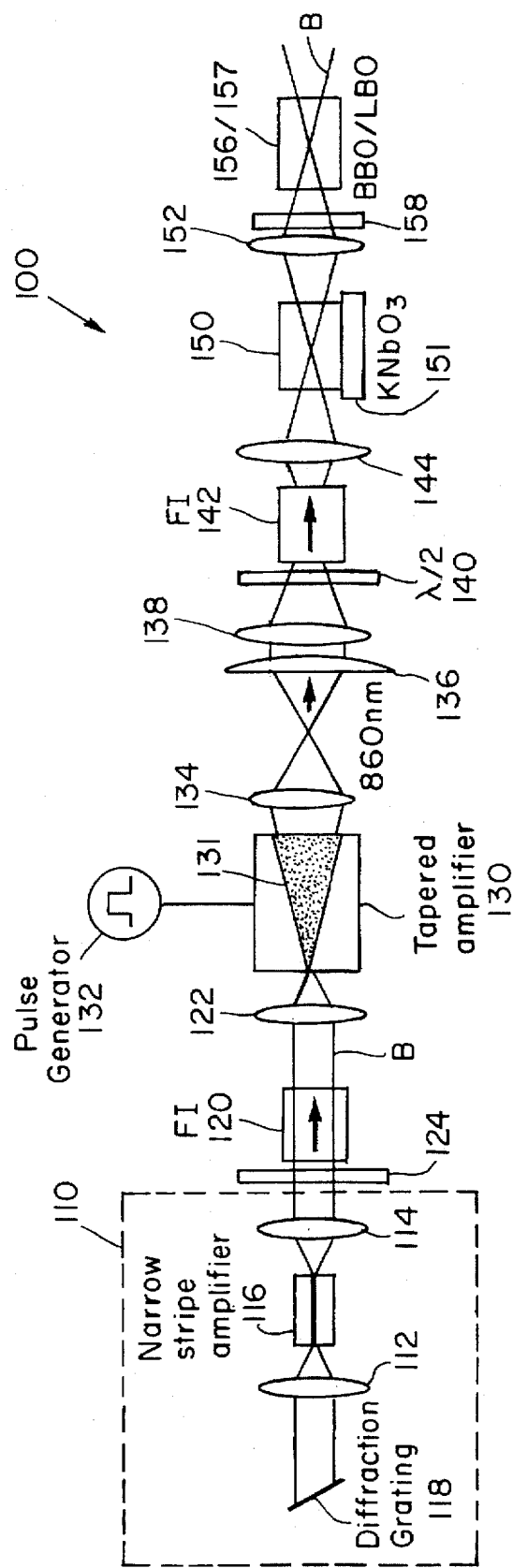
FIG. 1 is a schematic diagram of the diode laser-based ultraviolet light generating system of the present invention.

FIG. 1 is a schematic diagram showing a diode laser-based UV light generating system 100, which has been constructed according to the principles of the present invention.

The system 100 includes a diode-based laser device 110 that functions as a seed laser. It generates light B in the range of 700–1,200 nanometers, where high-powered diode lasers are commercially available; 860–885 nm is the preferred wavelength range for detecting NO and $SO_2$ after frequency quadrupling. The external-cavity diode laser shown is one alternative. Two lenses 112, 114 are placed at either end of a narrow stripe amplifier 116; a diffraction grating 118 is used for wavelength control and tuning. Alternatively, a conventional laser diode can be used, which is frequency tuned by varying temperature or current. In either case, a tuning range of approximately 30 nm can be expected with most commercial devices.

With the selection of either diode device, a half-wave plate 124 and a Faraday isolator 120 are used on the output to prevent optical feedback and preserve the spectral characteristics of the seed laser. The Faraday isolator 120 is an optical device that limits the propagation of light to only a single direction.

The seed laser 110 will typically have low power, approximately 50 mW. In some cases, a cw pre-amplification stage, not shown, may be required or helpful after the isolator 120. Typically, however, the subsequent tapered amplifier 130 can operate well with a very small input power.

The output of the seed laser B is focused by a first lens 122 (f=7.7 mm) for injection into a high-power, GaAlAs, tapered, semiconductor amplifier 130. The amplifier 130 has a gain region like a laser but is coated to have low reflection at its ends. The term "tapered" refers to the shape of the amplifier's active region 131, the cross-sectional area of which increases in the direction of the light's propagation.

One of the principle advantages associated with the tapered amplifier 130 is the fact that it keeps a constant power density across the amplifier's cross-section, i.e., perpendicular to the direction of beam amplification. This constant power density allows greater output powers to be generated since hot spots, common to rectangular amplifiers, are not created. This allows the tapered amplifier to operate at a higher power, but still operate below the damage threshold and with good beam quality. The tapered structure also allows the use of lower seed powers than comparable rectangular structures.

The tapered amplifier 130 is electrically powered by a pulse generator 132. Pulses are generated with a relatively low duty cycle, approximately 1 to 20 percent, and a pulse repetition rate of approximately 1 kHz to greater than 1 MHz. Pulse durations in the range of less than 1 nanosecond (nsec) to approximately 1 microsecond are possible. Preferably, the durations are 1 to 100 nsec. The generator 132 should be able to support peak currents of 10–15 amperes and with rise times of 1–10 nsec or less.

While tapered amplifiers typically will only generate one Watt of cw output power limited by average power dissipation, the peak power is limited by the damage threshold of the output facet. With available technology, peak powers of over 10 Watts have been achieved in this system.

Tapered amplifiers are typically used as unmodulated fixed gain amplifying elements. Conventionally, pulsed operation, which increases the conversion efficiency of the nonlinear crystals, is obtained from control of the seed laser. The advantages of the present invention, in which the tapered amplifier is pulsed, are two-fold.

First, pulsing the seed laser degrades its spectral characteristics. Mode-locked devices, for example, can have bandwidths of an Angstrom or greater. Similarly, electrically pulsing a cw laser degrades its spectral purity and can impact operational lifetimes. In contrast, the present invention employs a stable cw seed laser. If required, amplitude or frequency modulation can be accomplished using a mode that is consistent with maintaining the beam's spectral purity. Such modulation is common when lock-in detection is implemented to increase the signal-to-noise ratio. In any event, the seed laser need not be pulsed to increase frequency conversion efficiency.

Secondly, using a light amplifier set for a constant gain to amplify a pulsed beam suboptimally uses the amplifier when the objective is amplitude (power) maximization. The main limiting factor determining the obtainable light output from the amplifier is again heat dissipation. When amplifying a pulsed beam, especially a beam with a relatively low duty cycle, the amplifier is receiving electrical power even when there is no light to amplify. This generates heat, which impacts the maximum power that can be supplied to the amplifier. In contradistinction, the present invention typically injects a cw beam and then pulses the amplifier. Thus, the amplifier is receiving electrical power only when it is required to amplify. Therefore, higher amplitude beam outputs are obtainable from amplifiers with the same average power dissipation characteristics since heat generation during quiescent operation is avoided.

The tapered semiconductor amplifier emission B is collimated in the vertical and horizontal planes with a spherical lens 134 and a cylindrical lens 136. The second lens 134 has a focal length of 4.5 mm and a 0.5 numerical aperture. The focal length of the third lens 136 is 15 cm. This results in a near-unity aspect ratio beam. A fourth lens 138 focuses the collimated beam B through a second half wave ($\lambda/2$) plate 140 and a second Faraday isolator 142.

A fifth lens 144, having a focal length of 10 cm, is used to focus the beam into an a-cut, dual-wavelength, anti-reflection-coated $KNbO_3$ crystal 150, which can be approximately 2 cm long. This crystal 150 provides for second harmonic generation and is mounted to a thermoelectric element 151 for temperature control to allow noncritical phase matching. The second harmonic of the diode laser output B is generated by the crystal. A doubling efficiency of approximately 1–3 percent/(W cm)$^7$ should be expected, prior to the onset of pump depletion.

A high conversion efficiency (noncritical phase matching) makes $KNbO_3$ a clear choice for second harmonic generation. For third harmonic generation, ADA can provide noncritical phase matching. There are currently no nonlinear crystals available for noncritical second harmonic generation for ~430 nm radiation; angle tuned BBO is therefore the best crystal available for fourth harmonic generation.

Frequency quadrupling to generate UV light is achieved by focusing the output of the $KNbO_3$ crystal into a BBO crystal 156. This is accomplished by a sixth lens 152 having a focal length of 5.0 cm. The BBO crystal 156 is 6.0 mm long and positioned 14 cm behind the sixth lens 152. It is angle tuned to achieve phase matching for type I second harmonic generation. Wavelengths in the range of 200–250 nm are accessible by tuning the seed laser 110.

Alternatively, third harmonic generation can be carried out by replacing the BBO crystal with an ADA crystal, a temperature of which is adjusted to achieve non-critical phase matching. With third harmonic generation, wavelengths in the range of approximately 270–330 nm are accessible.

Frequency tripling to generate approximately 300 nm radiation is in principle more efficient than fourth harmonic generation since it relies on sum-frequency mixing of the weak second harmonic with the much stronger fundamental signal.

The temperature/angle of the nonlinear crystals 150, 156, 157 used for frequency conversion are adjusted to achieve phase matching for optimal conversion efficiency at the given infrared wavelength. If necessary, these parameters are varied actively as the seed laser wavelength 110 is tuned.

Figure 2:
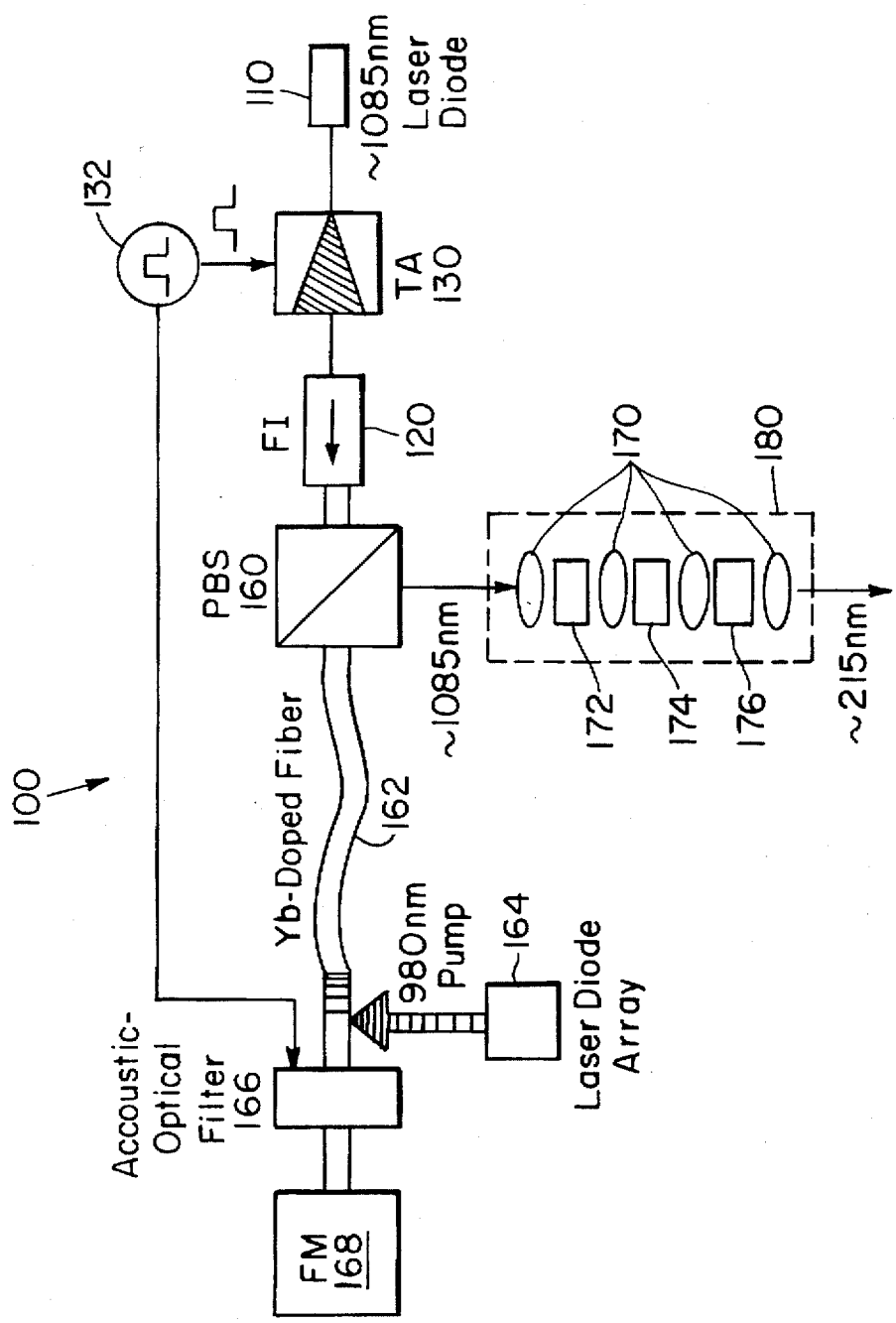
FIG. 2 is a schematic diagram of a second embodiment of the ultraviolet light generating system of the present invention.

FIG. 2 illustrates the components of a second embodiment 100 of the present invention. As in the embodiment of FIG. 1, a tunable, narrow-bandwidth, frequency-stable, cw, diode laser 110 operating in the IR seeds a tapered amplifier 130, which is driven by a pulse generator 132.

The cw seed laser 110 is a conventional, low-cost, narrow-bandwidth, tunable diode laser. Typical wavelength coverage is 30 nm per diode. The tapered semiconductor amplifier 130 is electrically pulsed, thereby providing tunable, narrow-bandwidth optical pulses with a duration and amplitude determined by the electrical pulse. Tapered amplifiers provide near-diffraction-limited output and are tunable over approximately 30 nm per diode.

Alternatively, since this embodiment relies on the subsequent fiber amplifier to produce the necessary peak powers, the tapered amplifier 130 can be replaced with other amplitude modulated seed sources. For example, an acousto-optic modulator, Pockels cell, fiber-coupled Mach-Zehnder interferometer, or pulsed distributed feedback laser could be used. In any case, the pulsed seed source should have a rise time of 0.1 to 10 ns and a pulse width of 0.1 to 100 ns.

The output of the tapered amplifier or other pulsed seed source in turn seeds Ytterbium-doped glass fiber amplifier 162 through a Faraday isolator FI 120 and a polarizing beam splitter PBS 160. These fiber amplifiers have slope conversion efficiency at ~1085 nm of ~80% when pumped by 980 nm laser diodes 164 and are capable of producing high average powers.

To achieve high peak powers, the tapered amplifier 130 used to seed the fiber 162 is electrically pulsed at low duty cycle with short pulse duration (<10 ns) and a peak power of 0.5–1 W. For a pulse period, T, significantly shorter than the 10 ms excited-state lifetime of $Yb^{3+}$, the peak amplifier output power, $P_{peak}$, is given by $P_{peak}=P_{avg}/D$, where $P_{avg}$ is the average power and D is the duty cycle of the fiber amplifier. Operating ranges of T=0.01–1 µs and D=0.1–1% are used to achieve $P_{peak}$=0.1–10 kW, where $P_{avg}$~1 W. Significantly higher peak and average powers have been demonstrated using fiber amplifiers.

A double-pass arrangement with a Faraday mirror 168 and an acoustic-optical filter 166, which is synchronized to the seed pulses, suppresses amplified spontaneous emission and compensates for birefringence in the fiber amplifier 162. An important feature of this embodiment is the fact that the output of the fiber amplifier 162 is linearly polarized in a plane orthogonal to that of the linearly polarized seed signal from the tapered amplifier 130 and can therefore be output-coupled by the polarizing beam splitter 160. Linear polarization of the fundamental radiation is required for efficient harmonic generation. The output power and polarization are stable.

Alternatively, a bandpass filter could be used in place of the acousto-optical filter to suppress spontaneous emission. A saturable absorber is another option. The transmittance of these devices is intensity dependent so that only the pulsed laser light causes the devices to pass light for amplification in the fiber amplifier while any weak light between pulses is blocked.

Frequency quintupling of the 1000–1100 nm output of the fiber amplifier 162 is provided by three stages of nonlinear frequency conversion 180, all of which are noncritically phase matched (temperature tuned). The second harmonic of the fundamental is generated in a $MgO:LiNbO_3$ crystal 172. The fourth harmonic is generated in an ADP crystal 174. The fundamental and fourth harmonic are then combined to generate the fifth harmonic at 215–220 nm in a KDP crystal 176. Focusing optics 170 are used to concentrate the beam in the crystals.

The conservative lower limit of $P_{peak}$=100 W and $P_{avg}$=1 W input to the frequency conversion stage 180 is estimated to produce ~1 mW of average UV power based on experimentally demonstrated conversion efficiencies. In the unsaturated regime, the fifth-harmonic power scales as the fifth power of the peak fundamental power. Thus, relatively modest increases in the $P_{peak}$ beyond 100 W (and $P_{avg}$ beyond 1 W) will lead to large increases in the available UV power. UV powers in excess of 100 mW are possible.

The addition of a fiber amplifier provides several advantages when compared to direct frequency conversion of diode lasers:

i) A much longer excited-state lifetime of the gain medium, ~10 ms for a fiber amplifier 162 vs. ~1 ns for a semiconductor amplifier 130, allows energy storage, resulting in higher peak powers. Peak powers of over 1 kW have been demonstrated with single-mode fiber amplifiers, a factor of 100 more than has been achieved with diode lasers. Larger peak power leads to a dramatic improvement in the efficiency of the nonlinear conversion process required for generation of visible and UV light.

ii) Fiber amplifiers take advantage of the availability of fiber-coupled components, making source packaging relatively simple, low cost, and rugged. All of the components used to construct the fiber amplifier are commercially available in a fiber-pigtailed form. These components can be connected by coupling of their fiber pigtails, resulting in a compact, hermetically sealed, alignment-free optical system.

iii) Diode-pumped fiber amplifiers are scalable to average powers significantly larger than the 1 W currently available from diffraction-limited laser diodes.

More generally, the rare-earth-doped fiber amplifiers are available in a number of other wavelength ranges. For instance, Yb-doped fibers exhibit gain at 1000–1150 nm, Er-doped fibers exhibit gain at 1500–1600 nm, and Nd-doped fibers exhibit gain at 900–950 nm, 1000–1150 nm, and 1320–1400 nm. Thus, most of the visible and UV spectral region can be accessed by frequency doubling, tripling, quadrupling, and quintupling of tunable fiber amplifiers. In many cases, one or more steps in the nonlinear conversion process can be noncritically phase matched, providing high conversion efficiency.

Figure 3:
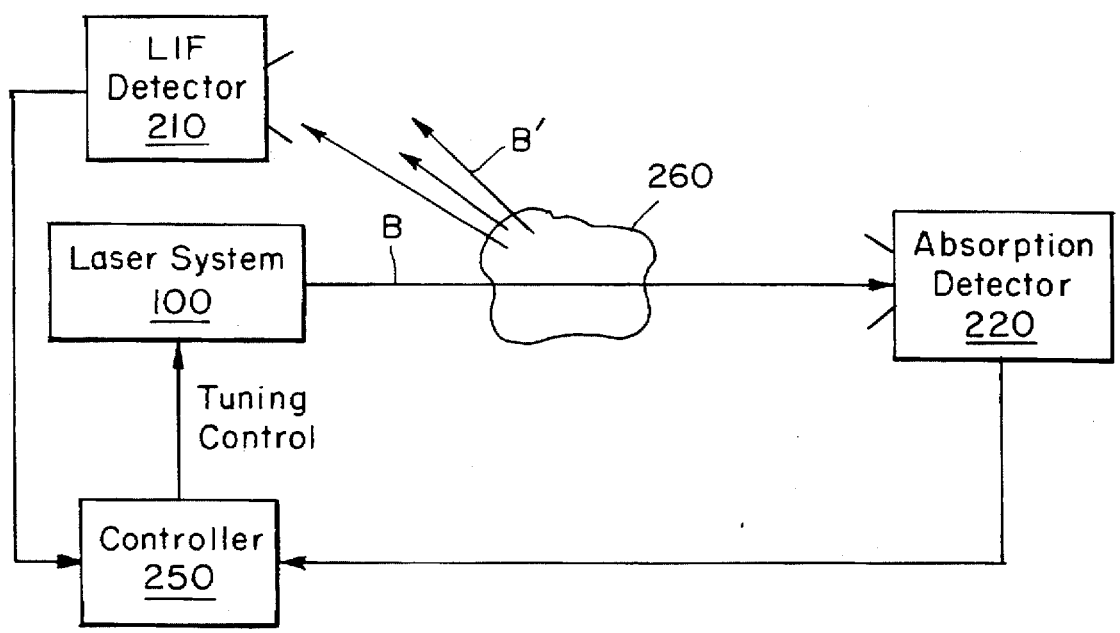
FIG. 3 is a schematic block diagram of a spectroscopic trace-species detection system of the present invention.

FIG. 3 is a block diagram showing a spectroscopic trace species detection system 200 for atmospheric gas detection implementing the principles of the invention. Such systems are used for detection of many small molecules and radicals of interest in studies of combustion and atmospheric chemistry. A few examples of these chemicals are NO, $SO_2$, and OH.

The laser diode UV light generating system 100 generates tunable UV radiation B in the 200–330 nm wavelength range. The small molecules and radicals of interest are generally active is this range.

The wavelength of the UV laser system is tuned on and off an absorption feature of a species of interest by a controller 250. The controller 250 may also amplitude and/or frequency modulate the diode to enable lock-in detection. One or both of two types of detection can be used. The first type relies on laser-induced fluorescence (LIF). An LIF detector 210 is sensitive to the fluorescence that occurs after the species of interest absorbs the UV light B from the laser system 100. The concentration or mixing ratio of the species 260 is determined from the intensity of the fluorescence B'. Alternatively, absorption spectroscopy can be used in which the reduction in intensity of the incident UV beam is measured by an absorption detector 220. The concentration of the absorbing species is proportional to the decrease in the beam's intensity.

The narrow bandwidth UV light generated by the laser system 100 provides for efficient excitation of the analyte, minimizing the excitation of interfering species and maximizing the on-line/off-line contrast ratio. Thus, the techniques are capable of highly specific and sensitive (parts per trillion or below) detection of a wide variety of chemical species.

The proposed laser system 100 is projected to weigh ~10 kg including electronics, is all solid state, is smaller than 0.03 $m^3$, consumes ~30 W of power, operates at room temperature, and can operate with no special cooling requirements. This combination of characteristics is ideal for LIF in general and for field measurements in particular. The wide tunability (~30 nm per diode, Yb-doped fiber gain from 1000 nm to 1150 nm for the second embodiment) of the proposed laser system will permit LIF detection of a number of atmospherically important molecules. In addition, the spectral properties of this light source will permit a broad range of applications (e.g. high-resolution spectroscopy, optical storage, photolithography). The pulse duration and repetition rate are widely variable (ms—ps and kHz—GHz, respectively, or cw), providing the flexibility to optimize the laser for each application.

While this invention has been particularly shown and described with references to preferred embodiments thereof, it will be understood by those skilled in the art that various changes in form and detail may be made therein without departing from the spirit and scope of the invention as defined by the appended claims.

We claim:

1. A solid-state tunable ultraviolet laser system, comprising:

a tunable diode laser which generates laser light;

a pulsed optical amplifier which pulse amplifies the laser light and is isolated from the tunable diode laser; and a frequency conversion stage which converts the pulsed laser light into ultraviolet light.

2. A laser system as described in claim 1, wherein the diode laser is a continuous wave laser.

3. A laser system as described in claim 1, further comprising a pulse generator which drives the optical amplifier.

4. A laser system as described in claim 1, wherein the optical amplifier is a tapered amplifier.

5. A laser system as described in claim 1, wherein the frequency conversion stage doubles and triples the laser light.

6. A laser system as described in claim 5, wherein the frequency conversion stage comprises $KNbO_3$ and ADA crystals.

7. A laser system as described in claim 1, wherein the frequency conversion stage doubles and quadruples the laser light.

8. A laser system as described in claim 7, wherein the frequency conversion stage comprises $KNbO_3$ and BBO crystals.

9. A solid-state tunable ultraviolet laser system, comprising:

a tunable diode laser which generates laser light;

a pulsed optical amplifier which pulse amplifies the laser light;

a frequency conversion stage which converts the pulsed laser light into ultraviolet light; and a power optical amplifier which amplifies the pulsed laser light from the pulsed optical amplifier prior to reception by the frequency conversion stage.

10. A laser system as described in claim 9, wherein the power amplifier is a fiber amplifier.

11. A laser system as described in claim 10, further comprising a beam splitter for coupling the pulsed laser light from the pulsed optical amplifier into the fiber amplifier, and for output coupling the beam from the fiber amplifier to the frequency conversion stage.

12. A laser system as described in claim 10, further comprising an acousto-optic filter for the fiber amplifier, which is synchronized to the pulsed optical amplifier.

13. A laser system as described in claim 10, further comprising a laser diode array for pumping the fiber amplifier.

14. A laser system as described in claim 10, wherein the frequency conversion stage frequency quintuples the light from the fiber amplifier.

15. A solid-state tunable ultraviolet laser system, comprising:
   a tunable diode laser which generates laser light;
   a pulsed optical amplifier which pulse amplifies the laser light;
   a frequency conversion stage which converts the pulsed laser light into ultraviolet light;
   a detector which senses the ultraviolet light; and
   a controller which tunes the diode laser on and off an absorption band of a species of interest and determines a presence of the species in response to light detected by the detector.

16. A laser system as described in claim 15, wherein the detector is tuned to a wavelength of the laser light.

17. A laser system as described in claim 15, wherein the detector is tuned to a wavelength of light that the species generates by fluorescence.

18. A laser system as described in claim 1, wherein the diode laser amplitude and/or frequency modulates the laser light.

19. A method for generating ultraviolet light, comprising:
   generating laser light with a tunable diode laser;
   pulse amplifying the laser light;
   isolating the laser light generation from the pulse amplification; and
   frequency converting the pulsed laser light into ultraviolet light.

20. A method as described in claim 19, further comprising pulse amplifying the laser light with a tapered optical amplifier.

21. A method as described in claim 19, further comprising driving the pulse amplifier with a pulse generator.

22. A method as described in claim 19, wherein the step of frequency converting the pulse laser light comprises:
   frequency doubling the laser light; and then
   frequency tripling the laser light.

23. A method as described in claim 19, wherein the step of frequency converting the pulse laser light comprises:
   frequency doubling the laser light; and then
   frequency quadrupling the laser light.

24. A method for generating ultraviolet light, comprising:
   generating laser light with a tunable diode laser:
   pulse amplifying the laser light;
   frequency converting the pulsed laser light into ultraviolet light; and
   tuning a frequency of the laser light on an off of an absorption feature of a chemical species.

25. A method as described in claim 24, further comprising detecting light absorbed by the chemical species.

26. A method as described in claim 24, further comprising detecting light generated by fluorescence by the chemical species.

27. A method for generating ultraviolet light, comprising:
   generating laser light with a tunable diode laser;
   pulse amplifying the laser light;
   frequency converting the pulsed laser light into ultraviolet light; and
   power amplifying the pulsed laser light prior to the frequency conversion.

28. A method as described in claim 27, wherein the step of amplifying the pulsed laser light comprises amplifying the pulsed laser light in a fiber amplifier.

29. A method as described in claim 27, further comprising time-domain filtering the pulsed laser light from the fiber amplifier to suppress amplified spontaneous emission.

30. A method as described in claim 19, wherein the step of frequency converting the laser light comprises frequency quintupling the pulsed laser light.

31. A method as described in claim 30, wherein the step of frequency quintupling comprises:
   generating a second harmonic of a fundamental of the pulsed laser light;
   generating a fourth harmonic of the fundamental; and
   mixing the fundamental with the fourth harmonic to generate a fifth harmonic.

32. A solid-state tunable ultraviolet laser system, comprising:
   a tunable diode laser which generates laser light;
   a pulsed optical amplifier which pulse amplifies the laser light;
   a frequency conversion stage which converts the pulsed laser light into ultraviolet light;
   a detector which senses the ultra-violet light; and
   a controller which tunes the diode laser on and off an absorption band of a species of interest and determines a presence of the species in response to light detected by the detector.

33. A laser system comprising:
   a pulsed seed laser source, which generates amplitude modulated laser light;
   a fiber amplifier, which power amplifies the amplitude modulated laser light; and
   a frequency conversion stage, which converts the amplified laser light into ultraviolet light.

34. A laser system as described in claim 33, wherein the pulsed seed laser source comprises:
   a continuous wave diode seed laser, which generates laser light; and
   an amplitude modulator, which amplitude modulates the laser light.

35. A laser system as described in claim 34, wherein the amplitude modulator comprises an electro-optic or acousto-optic modulator.

36. A laser system as described in claim 33, wherein the pulsed seed laser source comprises a pulsed distributed feedback laser.

37. A laser system, comprising:
   a pulsed seed laser source, which generates amplitude modulated laser light;
   a fiber amplifier, which power amplifies the amplitude modulated laser light;
   a frequency conversion stage, which converts the amplified laser light into ultraviolet light; and an acousto-optic filter, which suppresses amplified spontaneous emission in the fiber amplifier.

38. A laser system as described in claim 37, wherein the acousto-optic filter is synchronized with the pulsed seed laser source.

39. A laser system as described in claim 33, wherein the frequency conversion stage comprises three frequency conversion crystals for successively receiving the light from the fiber amplifier.

40. A laser system as described in claim 33, further comprising a saturable absorber for suppressing amplified spontaneous emission.

41. A laser system as described in claim 33, wherein the pulsed seed laser source is a pulsed diode laser.

42. A laser system as described in claim 34 wherein the amplitude modulator is a Mach-Zehnder interferometer.

43. A laser system as described in claim 1, further comprising an isolator between the diode laser and the pulsed optical amplifier.

44. A laser system as described in claim 9, further comprising an isolator between the diode laser and the pulsed optical amplifier.

45. A laser system as described in claim 34, further comprising an optical isolator between the continuous wave diode seed laser and the amplitude modulator.

46. A laser system as described in claim 33, further comprising a filter which suppresses amplified spontaneous emission in the fiber amplifier.

47. A laser system as described in claim 46, wherein the filter is a frequency-domain filter.

48. A laser system as described in claim 46, wherein the filter is a time-domain filter.

49. A laser system as described in claim 46, wherein the filter is an saturable absorber filter.

50. A laser system as described in claim 46, wherein the filter is an acousto-optic filter.

51. A laser system as described in claim 1, further comprising a pulse generator that drives the optical amplifier with a duty cycle less than 20%.

* * * * *